United States Patent
Sasaki et al.

(10) Patent No.: US 9,148,109 B2
(45) Date of Patent: Sep. 29, 2015

(54) MONOLITHIC CERAMIC ELECTRONIC COMPONENT

(71) Applicant: Murata Manufacturing Co., Ltd., Nagaokakyo-shi, Kyoto-fu (JP)

(72) Inventors: Ai Sasaki, Nagaokakyo (JP); Jun Urakawa, Nagaokakyo (JP)

(73) Assignee: Murata Manufacturing Co. Ltd., Kyoto (JP)

(*) Notice: Subject to any disclaimer, the term of this patent is extended or adjusted under 35 U.S.C. 154(b) by 338 days.

(21) Appl. No.: 13/721,351

(22) Filed: Dec. 20, 2012

(65) Prior Publication Data

US 2013/0162372 A1    Jun. 27, 2013

(30) Foreign Application Priority Data

Dec. 23, 2011 (JP) .................. 2011-282496

(51) Int. Cl.
| | |
|---|---|
| H03H 7/01 | (2006.01) |
| H01G 4/12 | (2006.01) |
| H01F 17/00 | (2006.01) |
| H01G 4/30 | (2006.01) |
| H03H 1/00 | (2006.01) |
| H01G 4/008 | (2006.01) |

(52) U.S. Cl.
CPC ......... H03H 7/0115 (2013.01); H01F 17/0013 (2013.01); H01G 4/0085 (2013.01); H01G 4/12 (2013.01); H01G 4/1227 (2013.01); H01G 4/30 (2013.01); H03H 1/00 (2013.01); *H01F 2017/0026* (2013.01); *H03H 2001/0085* (2013.01)

(58) Field of Classification Search
CPC ................ H03H 2001/0085; H03H 7/0115; H03H 1/00; H01G 4/30; H01G 4/0085; H01G 4/12; H01G 4/1227; H01F 17/0013; H01F 2017/0026
USPC ........................................ 333/185; 361/321.2
See application file for complete search history.

(56) References Cited

U.S. PATENT DOCUMENTS

2006/0261914 A1* 11/2006 Moriai et al. ................. 333/185
2006/0293168 A1    12/2006 Mori et al.
(Continued)

FOREIGN PATENT DOCUMENTS

| JP | 10-106880 A | 4/1998 |
|---|---|---|
| JP | 11-186727 A | 7/1999 |
| JP | 2004-063703 A | 2/2004 |

(Continued)

OTHER PUBLICATIONS

JP 2004111728; Hiroaki (English translation); Apr. 8, 2004.*
(Continued)

*Primary Examiner* — Benny Lee
*Assistant Examiner* — Rakesh Patel
(74) *Attorney, Agent, or Firm* — Keating & Bennett, LLP

(57) ABSTRACT

A monolithic ceramic electronic component includes at least two types of stacked ceramic layers having different dielectric constants and also includes internal electrodes partially disposed along boundaries between the ceramic layers having different dielectric constants. The internal electrodes include an additive component common to a component included in at least one of the ceramic layers adjacent to each other with the internal electrodes placed therebetween.

16 Claims, 6 Drawing Sheets

(56) References Cited

U.S. PATENT DOCUMENTS

2007/0237935 A1* 10/2007 Mori et al. .................... 428/210
2010/0149725 A1   6/2010 Hasegawa et al.

FOREIGN PATENT DOCUMENTS

| | | |
|---|---|---|
| JP | 2004-111728 A | 4/2004 |
| JP | 2004-281794 A | 10/2004 |
| JP | 2005-191129 A | 7/2005 |
| JP | 2009-088089 A | 4/2009 |
| TW | 201002644 A1 | 1/2010 |

OTHER PUBLICATIONS

Official Communication issued in corresponding Japanese Patent Application No. 2011-282496, mailed on Dec. 10, 2013.
Official Communication issued in corresponding Taiwanese Patent Application No. 10420832920, mailed on Jun. 24, 2015.

* cited by examiner

MONOLITHIC CERAMIC ELECTRONIC COMPONENT

BACKGROUND OF THE INVENTION

1. Field of the Invention

The present invention relates to monolithic ceramic electronic components, and particularly, to a monolithic ceramic electronic component including at least two types of stacked ceramic layers having different dielectric constants.

2. Description of the Related Art

Japanese Unexamined Patent Application Publication No. 2005-191129 discloses a monolithic ceramic electronic component including two types of stacked ceramic layers which have different dielectric constants and which are made of different materials, and internal electrodes partially disposed along boundaries between the ceramic layers. Monolithic ceramic electronic components including such ceramic layers made of different materials have the following problems.

In a calcination step for manufacturing a monolithic ceramic electronic component including ceramic layers made of different materials, a problem with the interdiffusion of the different materials between the ceramic layers often occurs. In the case in which internal electrodes are partially disposed along boundaries between ceramic layers made of different materials, when the ceramic layers and the internal electrodes are calcined together, the internal electrodes have a suppressive action on interdiffusion. However, this causes an increased amount of interdiffusion between portions having no internal electrodes. Therefore, a ceramic present outside the internal electrodes is altered, and therefore, the internal electrodes and the ceramic layers are likely to be deformed due to differences in the timing of shrinkage during calcination.

The disadvantage described above causes a problem in that the electrical properties exhibited by monolithic ceramic electronic components are deteriorated or variations in the electrical properties are increased, and particularly, causes a problem that when a monolithic ceramic electronic component is a capacitor, the capacitance of the capacitor is reduced or variations in the capacitance thereof is increased.

The disadvantage adversely affects the adhesion between ceramic layers made of different materials so as to cause delamination or interfacial separation between the ceramic layers.

It has been proposed to provide dummy electrodes or dummy ceramic layers between ceramic layers made of different materials to prevent the interdiffusion. However, providing the dummy electrodes or the dummy ceramic layers therebetween prevents a reduction in the size or the profile of monolithic ceramic electronic components.

SUMMARY OF THE INVENTION

To overcome the problems described above, preferred embodiments of the present invention provide a monolithic ceramic electronic component in which delamination or interfacial separation the deterioration of electrical properties and/or variations in electrical properties are prevented.

According to a preferred embodiment of the present invention, a monolithic ceramic electronic component includes at least two types of stacked ceramic layers having different dielectric constants and internal electrodes partially disposed along boundaries between the ceramic layers having different dielectric constants. The internal electrodes include an additive component common to a component included in at least one of the ceramic layers adjacent to each other with the internal electrodes disposed therebetween.

Since the internal electrodes include the additive component common to the component included in at least one of the ceramic layers adjacent to each other with the internal electrodes disposed therebetween as described above, the composition of the internal electrodes can be adjusted to be similar to the composition of at least one of the ceramic layers adjacent to each other with the internal electrodes disposed therebetween. This reduces the difference in the degree of interdiffusion between a portion including the internal electrodes and a portion not including internal electrodes so as to relieve the concentration of interdiffusion on the portion not including internal electrodes.

The additive component is preferably common to a component included in both of the adjacent ceramic layers. This is because, for example, a variation in electrical property, such as capacitance, can be prevented or minimized.

The additive component is preferably common to a major component of a ceramic material included in the ceramic layers. This effectively prevents or minimizes a variation in electrical property, such as capacitance, for example.

When the additive component is common to a major component of a ceramic material included in some of the ceramic layers that have a higher dielectric constant, a reduction in capacitance is prevented or minimized and a variation in the capacitance can be also prevented or minimized.

When the major component of the ceramic material included in the ceramic layers having a higher dielectric constant and the additive component are a Ba—Nd—Ti oxide, for example, a high capacitance and a low temperature coefficient of capacitance (TCC) are achieved.

The additive component may be common to a major component of a ceramic material included in some of the ceramic layers that have a lower dielectric constant. In this case, when the major component of the ceramic material included in the ceramic layers having a lower dielectric constant and the additive component are forsterite, a monolithic ceramic electronic component having a low relative dielectric constant and a high Qf value is obtained.

The additive component may be common to a component, included in both of the adjacent ceramic layers, other than a ceramic material, such as a glass component, for example. This can also effectively prevent or minimize, for example, a variation in electrical property, such as capacitance.

The internal electrodes may preferably include about 2 parts to about 20 parts by weight of the additive component per 100 parts by weight of a metal material, for example. This effectively prevents or minimizes a reduction in electrical property, such as capacitance, and a variation in electrical property, such as capacitance, for example.

In the monolithic ceramic electronic component according to a preferred embodiment of the present invention, the additive component is preferably unevenly distributed along both principal surfaces of each internal electrode. When the additive component is unevenly distributed along both principal surfaces of the internal electrode (interfaces between the internal electrodes and the ceramic layers), the adhesion strength of the internal electrodes to the ceramic layers can be increased. Furthermore, a central portion in a thickness direction of each internal electrode includes a small amount of the additive component and, therefore, has low electrical resistance. Thus, the loss of electrical properties is significantly reduced and prevented.

In the monolithic ceramic electronic component according to a preferred embodiment of the present invention, the internal electrodes may preferably include internal electrodes facing each other with the ceramic layers, having a higher dielectric constant, disposed therebetween to define a capacitor. This enables the ceramic layers having a higher dielectric constant to define a capacitor such that the monolithic ceramic electronic component has good high-frequency properties.

In the monolithic ceramic electronic component according to a preferred embodiment of the present invention, the internal electrodes preferably include a metal material, such as Cu, for example. This enables the internal electrodes to have low electrical resistance and, therefore, the loss of electrical properties to be small.

According to various preferred embodiments of the present invention, internal electrodes include a component common to a component included in ceramic layers. Thus, the composition of the internal electrodes can be adjusted to be similar to the composition of at least one of the ceramic layers adjacent to each other with the internal electrodes disposed therebetween as described above. This enables the difference in degree of interdiffusion between a portion including the internal electrodes and a portion not including internal electrodes to be reduced, and also enables the concentration of interdiffusion on the portion including no internal electrodes to be reduced.

Thus, a disadvantage that a ceramic present outside the internal electrodes is altered by interdiffusion and, therefore, the internal electrodes and the ceramic layers are deformed due to differences in timing of shrinkage is prevented.

Therefore, a problem that electrical properties exhibited by the monolithic ceramic electronic component are deteriorated or are significantly varied is prevented or minimized. In particular, when the monolithic ceramic electronic component defines a capacitor, a problem that the capacitance of the capacitance being reduced or the variation in capacitance thereof being increased is prevented or suppressed. Furthermore, delamination or interfacial separation between the ceramic layers, which are made of different materials, is prevented or minimized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
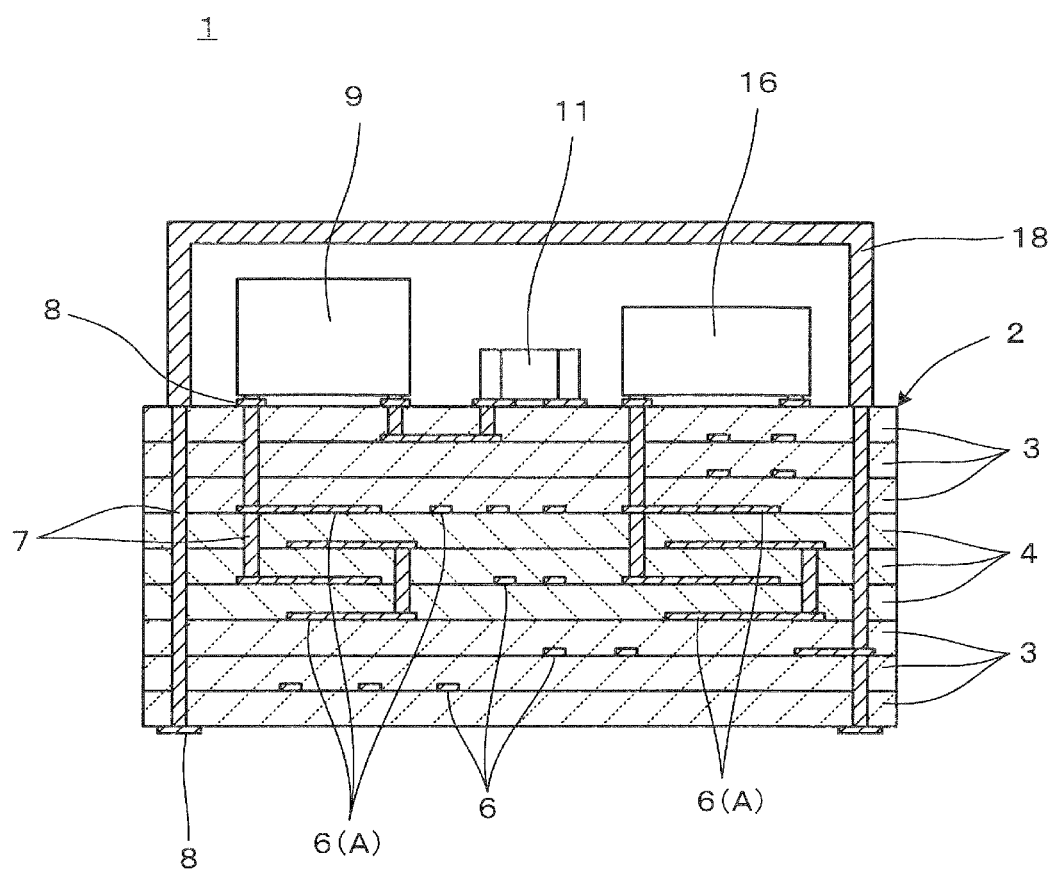
FIG. 1 is a sectional view of a ceramic multilayer module including a monolithic ceramic electronic component according to a first preferred embodiment of the present invention.

A ceramic multilayer module 1 including a monolithic ceramic electronic component 2 according to a first preferred embodiment of the present invention will now be described with reference to FIGS. 1 and 2.

The monolithic ceramic electronic component 2, which is included in the ceramic multilayer module 1, is defined by a multilayer ceramic substrate and includes a plurality of stacked low-dielectric constant ceramic layers 3 and high-dielectric constant ceramic layers 4. The low-dielectric constant ceramic layers 3 have a relatively low dielectric constant and the high-dielectric constant ceramic layers 4 have a relatively high dielectric constant. In the monolithic ceramic electronic component 2, the ceramic layers 3 are arranged so as to sandwich the ceramic layers 4.

The monolithic ceramic electronic component 2 includes various conductors. The conductors are internal electrodes 6 disposed along boundaries between the low-dielectric constant ceramic layers 3, boundaries between the high-dielectric constant ceramic layers 4, and boundaries between the low- and high-dielectric constant ceramic layers 3 and 4; via-hole conductors 7 extending through specific ones of the low- and high-dielectric constant ceramic layers and 4; and external electrodes 8 disposed on outer surfaces of the monolithic ceramic electronic component 2.

Some of the internal electrodes 6 that face each other with the high-dielectric constant ceramic layers 4 disposed therebetween are arranged so as to generate a capacitance, thereby defining capacitors.

Some of the internal electrodes 6 are disposed along boundaries between the low- and high-dielectric constant ceramic layers 3 and 4. In descriptions below, those disposed along such boundaries are referred to as "boundary internal electrodes" when necessary to be distinguished from others and are provided with reference numeral "6(A)".

A plurality of chip components 9 to 17 are mounted on the upper surface of the monolithic ceramic electronic component 2. The chip component 9 is, for example, a diode. The chip component 11 is, for example, a chip capacitor. The chip component 16 is, for example, a semiconductor integrated circuit (IC). The chip components 9 to 17 are electrically connected to selected ones of the external electrodes 8, which are disposed on the upper surface of the monolithic ceramic electronic component 2. The chip components 9 to 17 and conductors arranged in the monolithic ceramic electronic component 2 define circuits required for the ceramic multilayer module 1.

A conductive cap 18 that shields the chip components 9 to 17 is fixed on the upper surface of the monolithic ceramic electronic component 2. The conductive cap 18 is electrically connected to selected ones of the via-hole conductors 7.

The ceramic multilayer module 1 is mounted on a mother board, which is not shown, via selected ones of the external electrodes 8 that are disposed on the lower surface of the monolithic ceramic electronic component 2 so as to define connection terminals.

In the manufacturing of the monolithic ceramic electronic component 2, the internal electrodes 6, the via-hole conductors 7, and the external electrodes 8 are preferably co-fired. In this preferred embodiment, in order to reduce the disadvantage caused by interdiffusion between the low-dielectric constant ceramic layers 3 and the high-dielectric constant ceramic layers 4 in a calcination step and the presence of the boundary internal electrodes 6(A), the boundary internal electrodes 6(A) include an additive component common to a component included in at least one of the low- and high-dielectric constant ceramic layers 3 and 4 adjacent to each other with the boundary internal electrodes 6(A) disposed therebetween.

In particular, the low-dielectric constant ceramic layers 3 preferably include forsterite which is a major component and a Ba—Nd—Ti oxide which is a minor component and further include barium borosilicate glass and MnO which are sintering aids, for example. The high-dielectric constant ceramic layers 4 preferably include the Ba—Nd—Ti oxide which is a major component and forsterite which is a minor component and further include barium borosilicate glass and MnO, for example, which are sintering aids.

The boundary internal electrodes 6(A) preferably include the additive component common to the component included in at least one of the low- and high-dielectric constant ceramic layers 3 and 4 as described above. The boundary internal electrodes 6(A) further preferably include, for example, a metal material, such as Cu, which is a major component and a ceramic material such as the Ba—Nd—Ti oxide, forsterite, or barium borosilicate glass in addition to the additive component.

The additive component is preferably common to a component included in both of the low- and high-dielectric constant ceramic layers 3 and 4 that neighbor each other.

The additive component is preferably common to a major component of the ceramic material, such as the Ba—Nd—Ti oxide or forsterite, for example, included in at least one of the low- and high-dielectric constant ceramic layers 3 and 4 as described above.

When the major component of the ceramic material included in the high-dielectric constant ceramic layers 4 is the Ba—Nd—Ti oxide and the additive component is the Ba—Nd—Ti oxide as described above, high capacitance and a low temperature coefficient of capacitance (TCC) are achieved.

When the major component of the ceramic material included in the low-dielectric constant ceramic layers 3 is forsterite and the additive component is forsterite as described above, the monolithic ceramic electronic component 2 achieves a low relative dielectric constant and a high Qf value.

The additive component may preferably be common to barium borosilicate glass, which is a component other than the ceramic material included in both of the low- and high-dielectric constant ceramic layers 3 and 4.

In order to ensure the advantages resulting from the additive component, the boundary internal electrodes 6(A) preferably include about 2 parts to about 20 parts by weight of the additive component per about 100 parts by weight of the metal material, for example.

When a conductive paste used to form the boundary internal electrodes 6(A) includes the additive component, such as ceramic or glass, the additive component tends to migrate toward both principal surfaces of each boundary internal electrode 6(A). This results in the additive component being unevenly distributed along the principal surfaces of the boundary internal electrodes 6(A). Since the additive component is unevenly distributed along the principal surfaces of the boundary internal electrodes 6(A) (the interfaces between the boundary internal electrodes 6(A) and the low- and high-dielectric constant ceramic layers 3 and 4), the adhesion strength of the boundary internal electrodes 6(A) to the low- and high-dielectric constant ceramic layers 3 and 4 is increased. Since the concentration of the additive component in a central portion in a thickness direction of each internal electrode 6(A) is relatively low, the electrical resistance and the loss of electrical properties is reduced.

The low- and high-dielectric constant ceramic layers 3 and 4 commonly include forsterite, the Ba—Nd—Ti oxide, barium borosilicate glass, and MnO as described above. This is not directly related to the essence of the present invention and is effective to reduce interdiffusion.

The major component of the low-dielectric constant ceramic layers 3 is preferably forsterite as described above and may alternatively be alumina, a Ba—Al—Si oxide, or other suitable component, for example. The major component of the high-dielectric constant ceramic layers 4 is preferably Ba—Nd—Ti oxide as described above and may alternatively be $CaZrO_3$, $CaTiO_3$, or other suitable component, for example. Glass other than barium borosilicate glass may be used as a sintering aid.

The metal material included in the boundary internal electrodes 6(A) may be Ag, an Ag—Pd alloy, or other suitable metal material instead of Cu.

The internal electrodes 6 other than the boundary internal electrodes 6(A), the via-hole conductors 7, and the external electrodes 8 may have the same composition as that of the boundary internal electrodes 6(A) or a composition different from that of the boundary internal electrodes 6(A) and may include no additive component.

The monolithic ceramic electronic component 2 may preferably be manufactured by a known ceramic laminate co-firing technique, for example.

In order to form the low-dielectric constant ceramic layers 3, ceramic green sheets are first prepared. In particular, an organic vehicle including a binder resin and a solvent is added to a raw-material composition including the ceramic material and the sintering aids such that a ceramic slurry is obtained. The ceramic slurry is formed into sheets by, for example, a doctor blade process. After being dried, the sheets are punched into ceramic green sheets having a predetermined size. In order to form the conductors, a conductive paste is applied to the ceramic green sheets so as to form a predetermined pattern.

Ceramic green sheets, including the ceramic material, for the high-dielectric constant ceramic layers 4 are prepared in substantially the same manner as that used to form the ceramic green sheets for the low-dielectric constant ceramic layers 3. In order to form the conductors, a conductive paste is applied to these ceramic green sheets so as to form a predetermined pattern.

At least one of the conductive paste applied to the ceramic green sheets for the low-dielectric constant ceramic layers 3 and the conductive paste applied to the ceramic green sheets for the high-dielectric constant ceramic layers 4 is used to form the boundary internal electrodes 6(A) and includes the additive component, which is included in at least one of the low- and high-dielectric constant ceramic layers 3 and 4 as described above.

A predetermined number of the ceramic green sheets for the low-dielectric constant ceramic layers 3 and a predetermined number of the ceramic green sheets for the high-dielectric constant ceramic layers 4 are stacked in a predetermined order and are then pressed in a thickness direction.

A green laminate obtained as described above is calcined at a temperature of about 1,000° C. or lower, for example, about 800° C. to about 1,000° C. such that the monolithic ceramic electronic component 2 is obtained. The calcination of the laminate is preferably performed in a non-oxidizing atmosphere, such as a nitrogen atmosphere or in an oxidizing atmosphere such as an air atmosphere, when a major component of the conductors is Cu or Ag, respectively.

The chip components 9 to 17 are mounted on surfaces of the monolithic ceramic electronic component 2 by soldering or other suitable method and the conductive cap 18 is then attached to the upper surface of the monolithic ceramic electronic component 2 such that the ceramic multilayer module 1 is completed.

Second Preferred Embodiment

A monolithic ceramic electronic component 21 according to a second preferred embodiment of the present invention will be described with reference to FIGS. 3 to 5.

Figure 3:
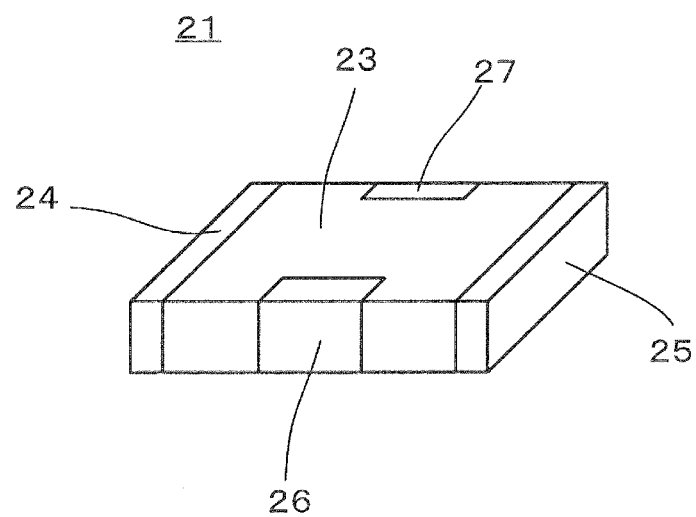
FIG. 3 is an outline perspective view of a monolithic ceramic electronic component according to a second preferred embodiment of the present invention.

With reference to FIG. 3, the monolithic ceramic electronic component 21 includes a component body 23 including a plurality of stacked ceramic layers, terminal electrodes 24 and 25 disposed on outer surfaces, that is, longitudinal end portions of the component body 23, and terminal electrodes 26 and 27 disposed in longitudinal intermediate portions of side surfaces of the component body 23.

Figure 4:
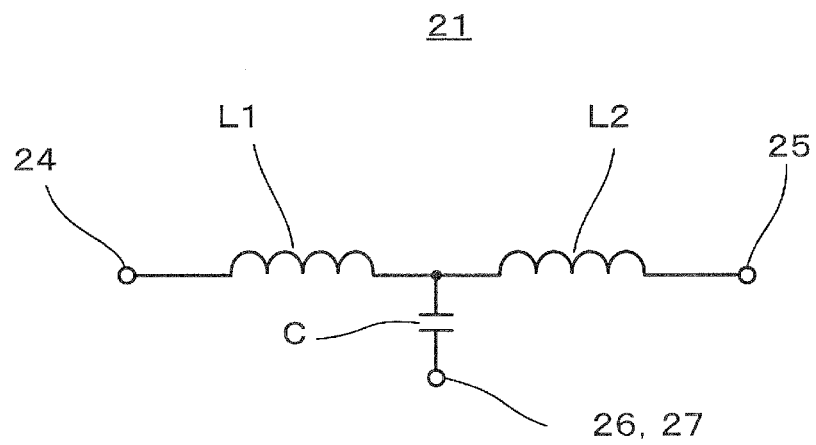
FIG. 4 is an equivalent circuit diagram of the monolithic ceramic electronic component shown in FIG. 3.

The monolithic ceramic electronic component 21 functions as an LC filter and includes two inductors L1 and L2 which are located between the terminal electrodes 24 and 25 and which are connected to each other in series and a capacitor C located between a junction between the inductors L1 and L2 and the terminal electrodes 26 and 27 as shown in FIG. 4.

Figure 5:
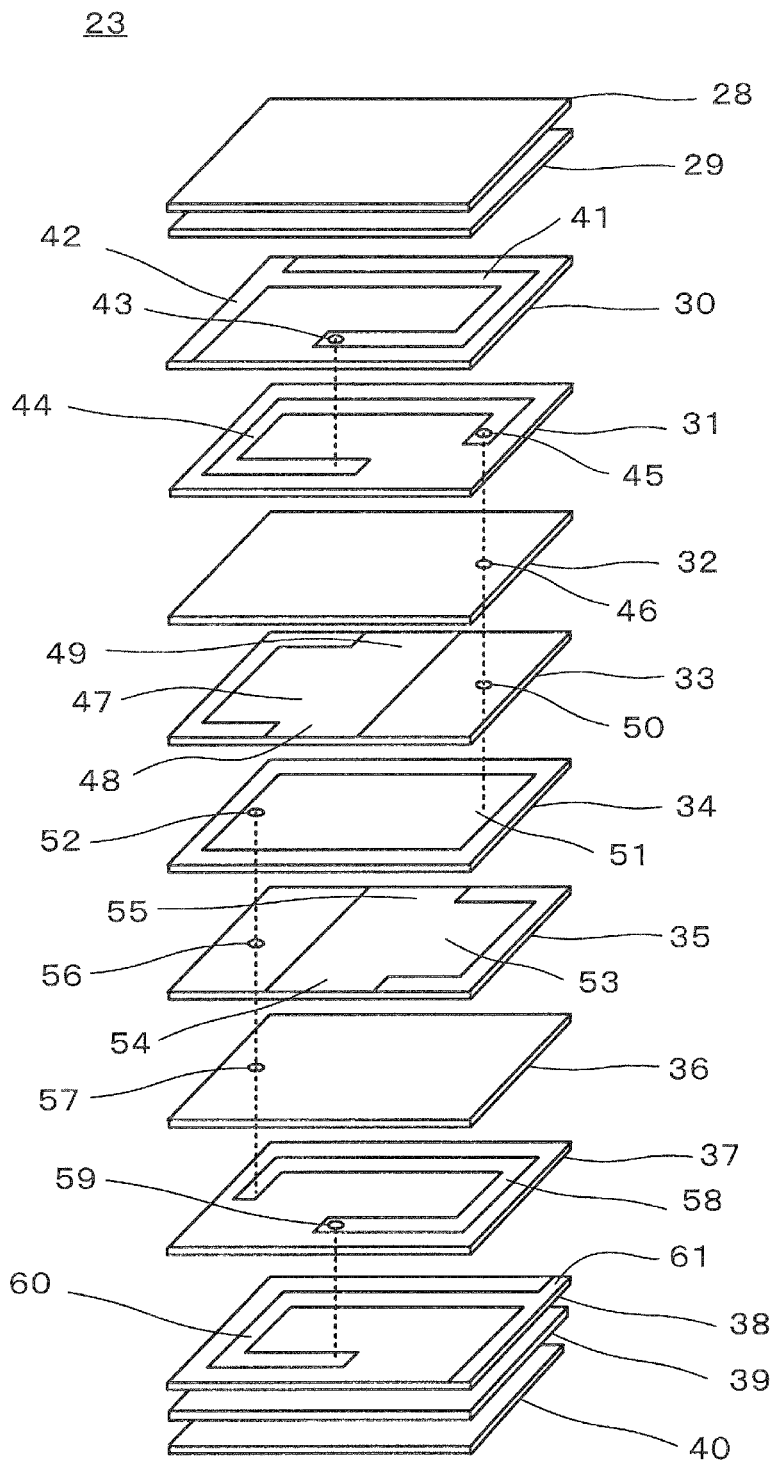
FIG. 5 is an exploded perspective view of a component body included in the monolithic ceramic electronic component shown in FIG. 3.

With reference to FIG. 5, the component body 23 includes a plurality of stacked ceramic layers 28 to 40. The number of the ceramic layers is not limited to the number of those shown in FIG. 5. Conductors are arranged on the ceramic layers 28 to 40 as described below such that the inductors L1 and L2 and the capacitor C are provided as shown in FIG. 4.

A coil pattern 41 defining a portion of the inductor L1 and a lead pattern 42 extending from one end of the coil pattern 41 are disposed on the ceramic layer 30. A via-hole conductor 43 is disposed on the other end of the coil pattern 41. The lead pattern 42 is connected to the terminal electrode 24.

A coil pattern 44 defining a portion of the inductor L1 is disposed on the ceramic layer 31. A via-hole conductor 45 is disposed on one end of the coil pattern 44. The other end of the coil pattern 44 is connected to the via-hole conductor 43.

A via-hole conductor 46 connected to the via-hole conductor 45 is disposed on the ceramic layer 32.

A capacitor pattern 47 defining a portion of the capacitor C and lead patterns 48 and 49 extending from the capacitor pattern 47 are disposed on the ceramic layer 33. The lead patterns 48 and 49 are connected to the terminal electrodes 26 and 27. A via-hole conductor 50 connected to the via-hole conductor 46 is disposed on the ceramic layer 33.

A capacitor pattern 51 defining a portion of the capacitor C and a via-hole conductor 52 connected to the capacitor pattern 51 is disposed on the ceramic layer 34. The capacitor pattern 51 is connected to the via-hole conductor 50.

A capacitor pattern 53 defining a portion of the capacitor C and lead patterns 54 and 55 extending from the capacitor pattern 53 are disposed on the ceramic layer 35. The lead patterns 54 and 55 are connected to the terminal electrodes 26 and 27. A via-hole conductor 56 connected to the via-hole conductor 52 is disposed on the ceramic layer 35.

A via-hole conductor 57 connected to the via-hole conductor 56 is disposed on the ceramic layer 36.

A capacitor pattern 58 defining a portion of the inductor L2 is disposed on the ceramic layer 37. A via-hole conductor 59 is disposed on one end of the coil pattern 58. The other end of the capacitor pattern 58 is connected to the via-hole conductor 57.

A capacitor pattern 60 defining a portion of the inductor L2 and a lead pattern 61 extending from one end of the capacitor pattern 60 are disposed on the ceramic layer 38. The lead pattern 61 is connected to the terminal electrode 25. The other end of the capacitor pattern 60 is connected to the via-hole conductor 59.

Figure 2:
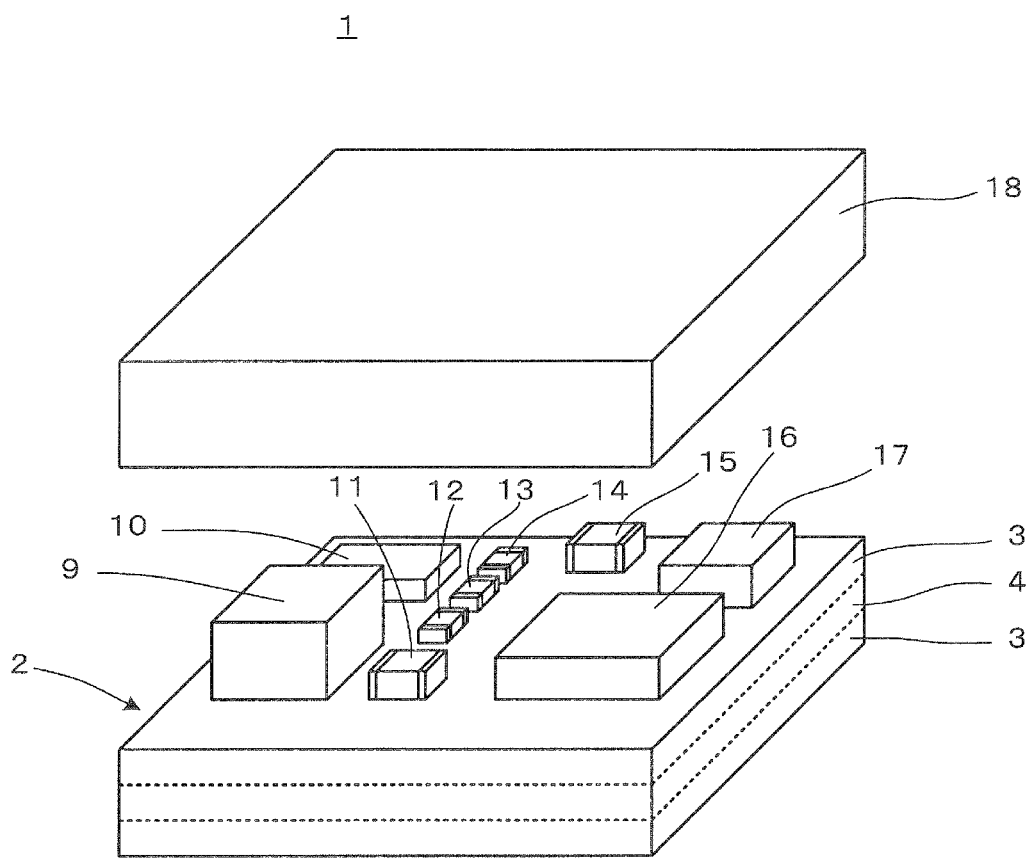
FIG. 2 is an exploded perspective view of the ceramic multilayer module shown in FIG. 1.

Among the ceramic layers 28 to 40, the ceramic layers 33 and 34, which together define the capacitor C, preferably include substantially the same high-dielectric constant ceramic material as that included in the high-dielectric constant ceramic layers 4 included in the monolithic ceramic electronic component 2 shown in FIG. 1 and the ceramic layers 28 to 32 and 35 to 40 preferably include substantially the same low-dielectric constant ceramic material as that included in the low-dielectric constant ceramic layers 3 included in the monolithic ceramic electronic component 2.

Thus, the ceramic layer 32 has a low dielectric constant and the ceramic layer 33 has a high dielectric constant. The capacitor pattern 47 is disposed along a boundary between the ceramic layers 32 and 33 and is an internal electrode. The ceramic layer 34 has a high dielectric constant and the ceramic layer 35 has a low dielectric constant. The capacitor pattern 53 is disposed along a boundary between the ceramic layers 34 and 35 and is an internal electrode.

A conductive paste is used to form the coil patterns 41, 44, 58, and 60; the lead patterns 42, 48, 49, 54, 55, and 61; the via-hole conductors 43, 45, 46, 50, 52, 56, 57, and 59; and the capacitor patterns 47, 51, and 53. For example, screen printing is used to apply the conductive paste. The capacitor patterns 47 and 53, which are the internal electrodes located along the above boundaries, include an additive component included in at least one of the ceramic layers 28 to 32 and 35 to 40, which have a low dielectric constant, and the ceramic layers 33 and 34, which have a high dielectric constant.

In order to obtain the component body 23, ceramic green sheets to be converted into the ceramic layers 28 to 40 are stacked in a predetermined order, are pressed in a thickness direction, and are then calcined at a temperature of about 1,000° C. or lower, for example, about 800° C. to about 1,000° C. Preferably, the calcination of the ceramic green sheets is performed in a non-oxidizing atmosphere such as a nitrogen atmosphere or in an oxidizing atmosphere such as an air atmosphere when a major component of the above patterns and conductors is Cu or Ag, respectively, similarly to the monolithic ceramic electronic component 2 described in the first preferred embodiment.

The following process is preferably used to form the terminal electrodes 24 to 27 on outer surfaces of the component body 23: a process including applying and baking a conductive paste principally including Cu or Ag or a thin film-forming process, such as vapor deposition, plating, or sputtering.

In the monolithic ceramic electronic component 21 obtained as described above, requirements applied to the boundary internal electrodes 6(A) described in the first preferred embodiment are applicable to the capacitor patterns 47 and 53.

In the monolithic ceramic electronic component 21, variations in properties due to interdiffusion between the ceramic layers 28 to 32 and 35 to 40, which have a low dielectric constant, and the ceramic layers 33 and 34, which have a high dielectric constant, are reduced and delamination or interfacial separation is prevented. Thus, the electrical properties of a coil are stabilized.

Preferred embodiments of the present invention are applicable to monolithic ceramic electronic components other than the monolithic ceramic electronic component 2, which defines a multilayer ceramic substrate, shown in FIG. 1 and the monolithic ceramic electronic component 21, which functions as an LC filter, shown in FIG. 3.

Experimental examples performed to confirm advantageous effects of various preferred embodiments of the present invention are described below.

Figure 6:
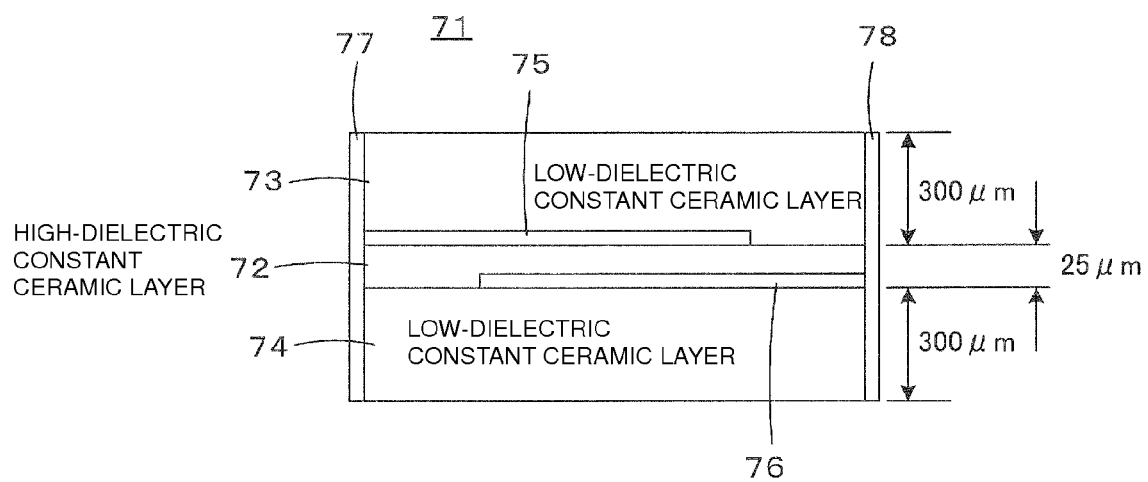
FIG. 6 is a sectional view of an evaluation sample prepared in an experiment example.

Evaluation Sample 71 having a cross-sectional structure shown in FIG. 6 was prepared. Evaluation Sample provided a capacitor and included two low-dielectric constant ceramic layers 73 and 74 having a thickness of about 300 µm and a high-dielectric constant ceramic layer 72, disposed therebetween, having a thickness of about 25 µm. An internal electrode 75 and an internal electrode 76 having a thickness of about 5 µm were partially disposed along a boundary between the high-dielectric constant ceramic layer 72 and the low-dielectric constant ceramic layer 73 and a boundary between the high-dielectric constant ceramic layer and the low-dielectric constant ceramic layer 74, respectively, such that a portion of the internal electrode 75 and a portion of the internal electrode 76 faced each other. External electrodes 77 and 78 were provided on end surfaces of Evaluation Sample 71 that faced each other such that the external electrode 77 and the external electrode 78 were connected to the internal electrode 75 and the internal electrode 76, respectively. Evaluation Sample 71 had a planar size of about 2.5 mm×about 2.0 mm.

The composition of each of the high-dielectric constant ceramic layer 72, the low-dielectric constant ceramic layers 73 and 74, and the internal electrodes 75 and 76 was as described below.

The high-dielectric constant ceramic layer 72 included about 82% of a Ba—Nd—Ti oxide, about 6% of forsterite, about 9% of barium borosilicate glass, and about 3% of MnO by weight. The low-dielectric constant ceramic layers 73 and 74 included about 62% of forsterite, about 10% of the Ba—Nd—Ti oxide, about 13% of barium borosilicate glass, and about 15% of MnO by weight. The internal electrodes 75 and 76 were formed using a conductive paste that was prepared such that an organic vehicle including a solvent and resin was added to an inorganic powder prepared by adding an additive component shown in Table 1 to about 100 parts by weight of Cu particles with an average size of about 1 µm to about 3 µm, the amount of the added additive component being shown in the column "Amount (parts by weight)" of Table 1, and the organic vehicle and the inorganic powder were kneaded in a three-roll mill.

Obtained evaluation samples were evaluated for capacitor capacitance, variation in capacitance, and interfacial separation as shown in Table 1. The capacitor capacitance was determined such that about 20 pieces of each sample were measured for capacitance at about 1 MHz using an LCR meter and the measurements were averaged. The variation in capacitance was the standard deviation ($\sigma$) of the measurements. The interfacial separation was evaluated by visually checking each sample.

Although delamination was evaluated, no delamination was observed in any of Samples 1 to 11 prepared in the experiment examples.

TABLE 1

| Samples | Additive component | Amount (parts by weight) | Capacitor capacitance (pF) | Variation in capacitance ($\sigma$) | Interfacial separation |
|---|---|---|---|---|---|
| 1* | Not contained | 0 | 23.4 | 0.5 | Not observed |
| 2 | Ba—Nd—Ti oxide | 10 | 23.2 | 0.1 | Not observed |
| 3 | Forsterite | 10 | 21.6 | 0.2 | Not observed |
| 4 | Barium borosilicate glass | 10 | 19.8 | 0.3 | Not observed |
| 5* | Zirconia | 10 | 16.6 | 0.6 | Observed |
| 6* | Alumina | 10 | 14.9 | 0.4 | Not observed |
| 7 | Ba—Nd—Ti oxide | 1 | 23.5 | 0.4 | Not observed |
| 8 | Ba—Nd—Ti oxide | 2 | 23.4 | 0.2 | Not observed |
| 9 | Ba—Nd—Ti oxide | 5 | 23.6 | 0.1 | Not observed |
| 10 | Ba—Nd—Ti oxide | 20 | 21.3 | 0.2 | Not observed |
| 11 | Ba—Nd—Ti oxide | 25 | 17.6 | 0.1 | Not observed |

In Table 1, asterisked samples are outside the scope of the present invention.

Sample 1 includes internal electrodes including no additive component and therefore is outside the scope of the present invention. Sample 1, which has a relatively large capacitor capacitance, has a large variation in capacitance. Therefore, the use of Sample 1 to manufacture products requiring high-precision capacitors, such as capacitors for use in band-pass filters, results in a reduction in yield.

Samples 2 to 4 and 7 to 11 each include internal electrodes including an additive component, such as the Ba—Nd—Ti oxide, forsterite, or barium borosilicate glass, common to ceramic layers and, therefore, are within the scope of the present invention. Samples 2 to 4 and 7 to 11 have a reduced variation in capacitance as compared to Sample 1.

Among Samples 2 to 4 and 7 to 11, Samples 2 and 8 to 10, in which the internal electrodes include the Ba—Nd—Ti oxide which is a major component of high-dielectric constant ceramic layers defining a capacitor and the amount of the added Ba—Nd—Ti oxide is about 2 parts to about 20 parts by weight, are not substantially reduced in capacitor capacitance as compared to Sample 1.

Among Samples 2 and 7 to 11, which include the internal electrodes including the Ba—Nd—Ti oxide, Sample 7, in which the amount of the added Ba—Nd—Ti oxide is less than about 2 parts by weight, has a variation in capacitance of about 0.4, which is less than that of Sample 1 and is not very small. Sample 11, in which the amount of the added Ba—Nd—Ti oxide is more than about 20 parts by weight, that is, about 25 parts by weight, has a reduced variation in capacitance and, however, also has a reduced capacitor capacitance as compared to Sample 1 because the degree of metallization of the internal electrodes is relatively low and the effective electrode area of a capacitor is relatively small (low coverage). These show that the amount of the added Ba—Nd—Ti oxide is preferably selected within the range of about 2 parts to about 20 parts by weight, for example.

Sample 7 is within the scope of the present invention because Sample 7 is improved in that Sample 7 is not reduced in capacitor capacitance as compared to Sample 1, which includes the internal electrodes including no additive component. Sample 11 is within the scope of the present invention because Sample 11 is improved in that Sample 11 has less variation in capacitor as compared to Sample 1, which includes the internal electrodes including no additive component.

Samples 5 and 6 each include internal electrodes which include no component common to a high-dielectric constant ceramic layer and low-dielectric constant ceramic layers and include an additive component, such as zirconia or alumina, which is not a common component. Samples 5 and 6 have less capacitor capacitance and a larger variation in capacitance as compared to Sample 1. In Sample 5, in which zirconia is included, separation was observed at interfaces between ceramic layers and the internal electrodes extending to end surfaces of an evaluation sample. This is probably because the additive component in the internal electrodes reacted with a ceramic material and therefore was altered.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A monolithic ceramic electronic component comprising:
   at least two types of stacked ceramic layers having different dielectric constants; and
   internal electrodes at least partially disposed between the at least two types of ceramic layers having different dielectric constants; wherein
   the internal electrodes include an additive component common to a component of a material included in two ceramic layers of the at least two types of stacked ceramic layers that are adjacent to each other with the internal electrodes disposed therebetween.

2. The monolithic ceramic electronic component according to claim 1, wherein the internal electrodes include first internal electrodes facing each other with at least one of the at least two types of ceramic layers, having a higher dielectric constant, disposed therebetween to define a capacitor.

3. The monolithic ceramic electronic component according to claim 1, wherein the additive component is common to a major component of a ceramic material included in the at least two types of ceramic layers.

4. The monolithic ceramic electronic component according to claim 3, wherein the additive component is common to the major component of the ceramic material included in at least two of the at least two types of ceramic layers that have a higher dielectric constant than other ceramic layers of the at least two types of ceramic layers.

5. The monolithic ceramic electronic component according to claim 4, wherein the major component and the additive component is a Ba—Nd—Ti oxide.

6. The monolithic ceramic electronic component according to claim 3, wherein the additive component is common to the major component of the ceramic material included in at least two of the at least two types of ceramic layers that have a lower dielectric constant than other ceramic layers of the at least two types of ceramic layers.

7. The monolithic ceramic electronic component according to claim 6, wherein the major component and the additive component are forsterite.

8. The monolithic ceramic electronic component according to claim 1, wherein the additive component is common to the component of the material, included in both of the adjacent ceramic layers, other than a ceramic material.

9. The monolithic ceramic electronic component according to claim 1, wherein the internal electrodes include about 2 parts to about 20 parts by weight of the additive component per 100 parts by weight of a metal material included in the internal electrodes.

10. The monolithic ceramic electronic component according to claim 1, wherein the additive component is unevenly distributed along both principal surfaces of each of the internal electrodes.

11. The monolithic ceramic electronic component according to claim 1, wherein the internal electrodes include a metal material.

12. The monolithic ceramic electronic component according to claim 11, wherein the metal material is an Ag—Pd alloy.

13. The monolithic ceramic electronic component according to claim 11, wherein the metal material is Cu.

14. The monolithic ceramic electronic component according to claim 11, wherein the metal material is Ag.

15. The monolithic ceramic electronic component according to claim 1, further comprising at least one chip component disposed on an upper surface of the at least two types of stacked ceramic layers and being electrically connected to at least one of the internal electrodes.

16. The monolithic ceramic electronic component according to claim 15, further comprising a conductive cap disposed on the upper surface of the at least two types of stacked ceramic layers and arranged to cover the at least one chip component.

* * * * *